United States Patent [19]

Smith et al.

[11] Patent Number: 5,377,961
[45] Date of Patent: Jan. 3, 1995

[54] ELECTRODYNAMIC PUMP FOR DISPENSING MOLTEN SOLDER

[75] Inventors: Ted M. Smith, Austin, Tex.; Russell E. Winstead, Raleigh, N.C.

[73] Assignee: International Business Machines Corporation, Armonk, N.Y.

[21] Appl. No.: 48,446

[22] Filed: Apr. 16, 1993

[51] Int. Cl.[6] .............................................. B22D 37/00
[52] U.S. Cl. ................................. 266/237; 222/590; 222/594
[58] Field of Search ..................... 222/590, 594, 593; 266/236, 237

[56] References Cited

U.S. PATENT DOCUMENTS

| | | | |
|---|---|---|---|
| 3,222,776 | 12/1965 | Kawecki | 266/200 |
| 3,515,898 | 6/1970 | Von Starck | 307/118 |
| 3,807,903 | 4/1974 | Gelfgat et al. | 417/50 |
| 4,023,783 | 5/1977 | Moreau | 266/237 |
| 4,216,800 | 8/1980 | Garnier et al. | 137/807 |
| 4,398,589 | 8/1983 | Eldred | 222/594 |
| 4,566,859 | 1/1986 | Thissen et al. | 266/237 |
| 4,754,900 | 7/1988 | MacKay | 222/590 |
| 4,828,886 | 5/1989 | Hieber | 427/422 |
| 4,842,170 | 6/1989 | De Vecchio et al. | 222/594 |
| 5,229,016 | 7/1993 | Hayes et al. | 222/593 |

FOREIGN PATENT DOCUMENTS

| | | |
|---|---|---|
| 0491599 | 6/1992 | European Pat. Off. . |
| 1480209 | 5/1967 | France . |
| 21111586 | 2/1972 | France . |
| 56-144977 | 11/1981 | Japan . |
| 1067070 | 1/1984 | U.S.S.R. ............... 266/237 |

Primary Examiner—Scott Kastler
Attorney, Agent, or Firm—Mark E. McBurney

[57] ABSTRACT

A system is provided for depositing an extremely small amount of solder on a printed circuit board by varying the direction of an electric current applied to a solder stream. The force exerted on the solder can be substantially instantaneously reversed without the necessity of changing the form of the energy applied to the solder from electrical to vibratory, ultrasonic, magnetic, or the like. The direction and magnitude of the force is related to the cross product of an electric current vector and a magnetic field vector ($F = I \times B$). A programmable current source is used to place an electric current through the liquid solder as it is flowing through a conduit. A magnetic coil is disposed adjacent the conduit in order to provide a magnetic field in the same plane as the electric current. The conduit supplies liquid solder to a nozzle which then deposits a droplet of solder onto a printed circuit board. Therefore, as the current is applied, in a first direction through the solder, an outward force is exerted on the solder. When the direction of the current is reversed, then the direction of the force exerted on the solder is also reversed, and an extremely small droplet of solder is "snapped off" of the solder stream.

9 Claims, 4 Drawing Sheets

ELECTRODYNAMIC PUMP FOR DISPENSING MOLTEN SOLDER

BACKGROUND OF THE INVENTION

1. Field of the Invention

The present invention generally relates to depositing molten solder onto a printed circuit board (PCB) or other electronic device. More particularly, a molten solder dispenser is provided which accurately deposits an extremely small amount onto the circuit board or device to accommodate the extremely close spacing present on integrated circuit devices (IC) which are currently being fabricated.

2. Description of Related Art

With advances in chip fabrication technology, an ever increasing number of integrated circuits are being built into the chips. This growing number of devices, requires a correspondingly greater number of input-/output (I/O) connection points to be provided to the chips. The effect, to the computer fabrication industry, of closely spacing these I/Os is to require a system that can mechanically dispose and electrically connect the chips to a printed circuit board, for use in a computer system. Of course, it is well known to use solder as a means of providing both of these functions and there are many conventional systems for dispensing solder onto a printed circuit board.

For example, U.S. Pat. No. 4,828,886 uses a piezoelectric transducer to propel solder droplets onto a work piece. Other conventional systems (U.S. Pat. Nos. 3,222,776 and 4,754,900) utilize ultrasonic generators to create ultrasonic vibrations near a nozzle, or the like to urge solder onto a wettable surface.

Additionally, electromagnetic devices are known in the art which control the flow of metal through a conduit, or the like. For example, U.S. Pat. No. 4,842,170, describes an electromagnetic pump, which includes and alternating current coil adjacent a nozzle. The coil produces a magnetic field which induces a current in the liquid metal and urges the metal through the nozzle. The nozzle includes a nonconductive insert which redirects the induced eddy currents in the axial direction to enhance the metal flow. The insert may be positioned so as to impede the flow of the liquid metal such that the electromagnetic pump acts as a valve. U.S. Pat. No. 3,807,903 is another example of a conventional system wherein the magnetic field is varied to induce electrical current in the conductive metal flowing through a pipe. Additionally, varying the induced current changes the value of heat dissipation energy taken from the flow of the conductive liquid to hydrodynamically control the flow rate of the liquid.

U.S. Pat. Nos. 4,398,589; 4,566,859; and 3,515,898 all describe various electromagnetic pumps for conveying conductive material through a conduit. An "electromagnetic conduit" is described by U.S. Pat. No. 4,216,800 wherein electrical conductors are disposed along an axis which coincides with the axis to be imposed on a stream of conductive liquid. High frequency alternating currents are passed along successive conductors in opposite directions to contain the liquid stream.

Other conventional systems include those using ink jet technology to deposit droplets of solder on a PCB or the like. In these systems, a piezoelectric crystal is used to urge the solder through a charge electrode and past deflection plates to guide the solder onto the substrate. It is noted that, piezoelectric materials exhibit poor temperature characteristics when used with molten metal materials, i.e. they are not capable of withstanding the elevated temperatures required for maintaining the material in a molten state.

In order to deposit the small amount of solder on a PCB that is now being required by today's technology, it is necessary to have a means that will not only urge to solder outward onto the board, but also reverse the outward flow of the solder and create and inward flow to effectively "snap off" the desired amount of solder. The previously discussed references which discuss the deposition of solder, use either ultrasonic energy or expansion and contraction induced by piezoelectric materials to urge the solder onto the board. While the piezoelectric materials are capable of pushing solder outward, each expansion of the material is coupled with a corresponding contraction. Therefore, the piezoelectric material is not capable of providing a constant pressure on the solder material, in either direction, as provided by the present invention. The ultrasonic energy effectively induces a high frequency vibratory motion that "shakes" the solder out of a nozzle. Further, both of these methods require electrical energy to be converted into another form (sound or mechanical) before any force is exerted on the solder. The previously described electromagnetic pumps also require that electrical energy be converted to magnetic energy before any force can act upon the conductive liquid. In order to reverse the direction of flow in these pumps, electric current in a first direction must be applied to a coil to set up the magnetic field. The direction of the current must then be reversed and the magnetic field collapses as the current passes through zero. The magnetic field is then setup in the opposite direction to induce current in the conductive material. All of these steps must occur before the force acting on the solder can be reversed. Those skilled in the art will understand that a relatively long amount of time is required for these steps to be implemented.

Therefore, it can be seen that a need exists for a system with the appropriate temperature characteristics that can apply a constant outward force of varying duration to a stream of solder and then substantially instantaneously reverse the direction of the force applied to the solder in order to "snap off" a droplet of solder for use in attaching chips having I/Os with extremely close spacing to a printed circuit board or device. The reverse direction of the force will also be constant and of a duration required by the application.

SUMMARY OF THE INVENTION

In contrast to the prior art, the present invention provides a system for depositing an extremely small amount of solder on a printed circuit board using electrodynamic principles. More particularly, by varying the direction of the electric current applied to the system, the force exerted on the solder stream is substantially instantaneously reversed without the necessity of changing the form of the energy from electrical to vibratory, ultrasonic, magnetic, or the like.

Broadly, the present invention uses one of the fundamental principles of electrical engineering to apply a force to the liquid solder. That is, the direction and magnitude of the force applied to a conductor is related to the cross product of an electric current vector and a magnetic field vector ($F = I \times B$). The directional relationship is governed by the "right hand rule" wherein the direction of the force is perpendicular to the plane in which the current and magnetic field vectors lie.

The system of the present invention uses a programmable current source to place an electric current through the liquid solder as it is flowing through a conduit. Additionally, a magnet or magnetic coil is disposed adjacent the conduit in order to provide a magnetic field in the same plane as the electric current. The conduit supplies liquid solder to a nozzle which then deposits a droplet of solder onto a printed circuit board, or the like. The magnetic coil and current source are disposed such that the plane in which the magnetic field and current vector lie is perpendicular to the axial direction of the conduit with the liquid solder therein. Therefore, as the current is applied, in a first direction through the solder, a force is exerted on the solder in a direction consistent with the "right hand rule". Conversely, if the direction of the current is reversed, then the direction of the force exerted on the solder is also reversed. Therefore, those skilled in the art will appreciate how the present invention is capable of substantially instantaneously reversing the force exerted on the solder, by selectively alternating the current therethrough. Further, it can be seen that by reversing the force exerted on the solder, immediately subsequent to applying a force on the solder to urge it outwardly from the nozzle, an extremely small droplet of solder can be dispensed from the nozzle and deposited on a PCB, or the like.

None of the previously described references are capable of substantially instantaneously reversing the force exerted on the liquid solder in the same manner as the present invention, since they all teach using forms of energy, other than electricity, to apply the force to the conductive fluid, e.g. ultrasonic vibrations, piezoelectric mechanical motion, or electric current induced by an alternating magnetic field. More particularly, the piezoelectric methods require symmetrical forces to be exerted on the liquid solder. That is, for each outward force (e.g. and expansion of the piezoelectric member) there must be a corresponding inward force (e.g. contraction of the member). It is not possible to maintain a constant force on the liquid solder, in either direction, as in the present invention. Further, piezoelectric material has inadequate temperature characteristics, when compared to the present invention.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1A:
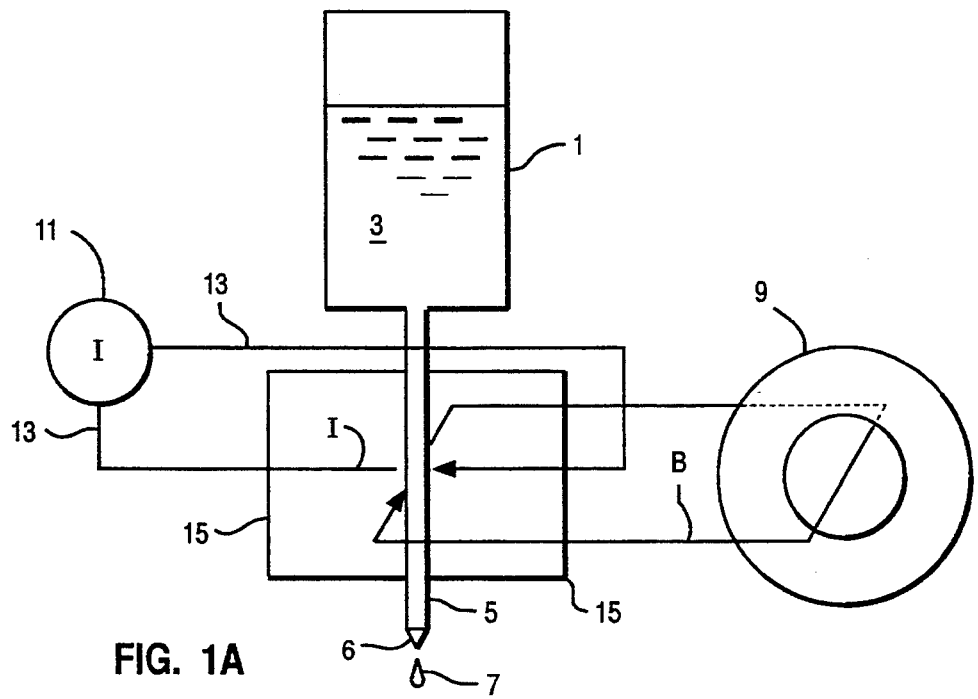
FIG. 1 is a schematic diagram showing the major components of the solder deposition system of the present invention and includes a printed circuit board on which the solder is to be placed.
Figure 1:
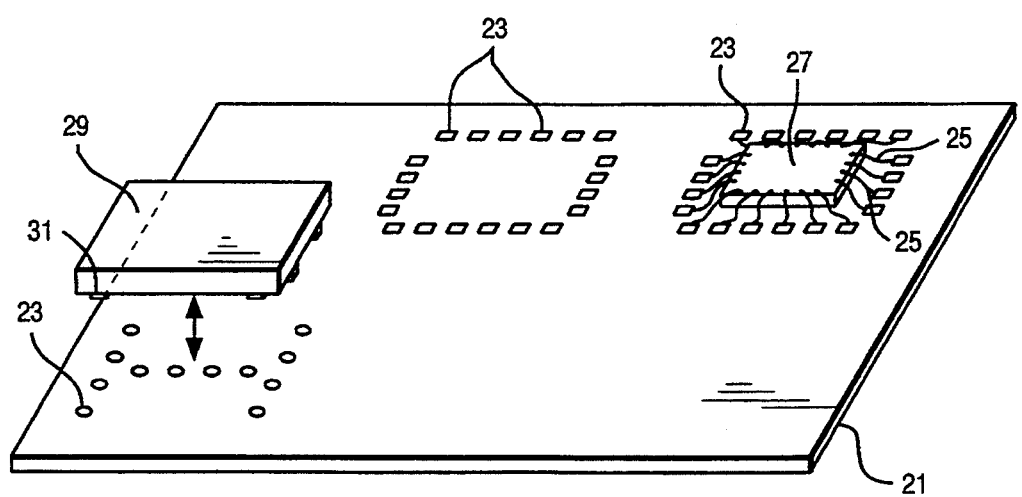

Referring to FIG. 1, an exploded schematic view of the present invention is shown and will be described, wherein reservoir 1 contains a quantity of liquid conducting material 3, which in the preferred embodiment consists of solder containing various quantities of tin and lead. Conduit 5 is shown for transporting solder 3 to a nozzle 6, to form solder 3 into droplets 7 which are then deposited on printed circuit board 21. PCB 21 may be a planar, feature card, or the like which is used in a computer system. Magnet 9, which may be a permanent magnet or electromagnetic coil, is shown and provides a magnetic field perpendicular to the flow of solder 3 through conduit 5. In a preferred embodiment, an electromagnetic coil is utilized to provide the magnetic field. In any event, a means for producing a magnetic field is disposed adjacent conduit 5 such that the magnetic field is perpendicular to the flow of solder therethrough (see FIG. 2).

Additionally, a programmable current source 11 is provided, such as those which are computer controlled, having amplification to provide current spikes up to approximately 20 amps. Leads 13 connect current generator 11 to electrodes 15 which pass current through solder 3 in a direction dependent upon the current direction provided by current source 11. It should be noted that electrodes 15 are capable of transmitting electrical current through solder 3 by any of several mechanical configurations. For example, electrodes 15 may extend into conduit 5 such that electrical contact is made between electrodes and the solder passing through the conduit. Insulating material, such as polyimide film or ceramic coatings are used to maintain electrical insulation between the magnetic core 59 (FIG. 4) and electrodes 15. Additionally, conduit 5 is constructed of an electrical insulating material such that the only conducting path available to the current is through the solder, not around the periphery of the conduit. This concentrates the current flow through the solder, thereby preventing current loss, and a corresponding loss of solder 3 such that an electric field is produced in solder 3 which is coplanar with the magnetic field produced by coil 9.

PCB 21 is capable of receiving various types of integrated circuit devices thereon. It will be understood by those skilled in the art that droplets 7 are deposited on interconnection pads in communication with circuitized lines of a surface PCB 21. The present invention contemplates droplets 7 placed on PCB 21 having a size of 4 mils in diameter. (0.004 inches). Reference numeral 23 represent solder droplets 7 which have been placed on PCB 21. Integrated circuit device 27 is characterized as a surface mount technology type of device which includes leads 25 which contact solder pads 23 placed on PCB 21 by the present invention. Additionally, a direct chip attach device 29, or "flip chip" is shown with electrical connection pads 31 thereon which must contact input/output points on the surface of PCB 21. In accordance with the present invention, solder droplets 7 are placed on the connection pads of PCB 21 such that flip chip device 29 can be affixed thereto. The foregoing is a practical description of the context in which the present invention is to be used.

Figure 2:
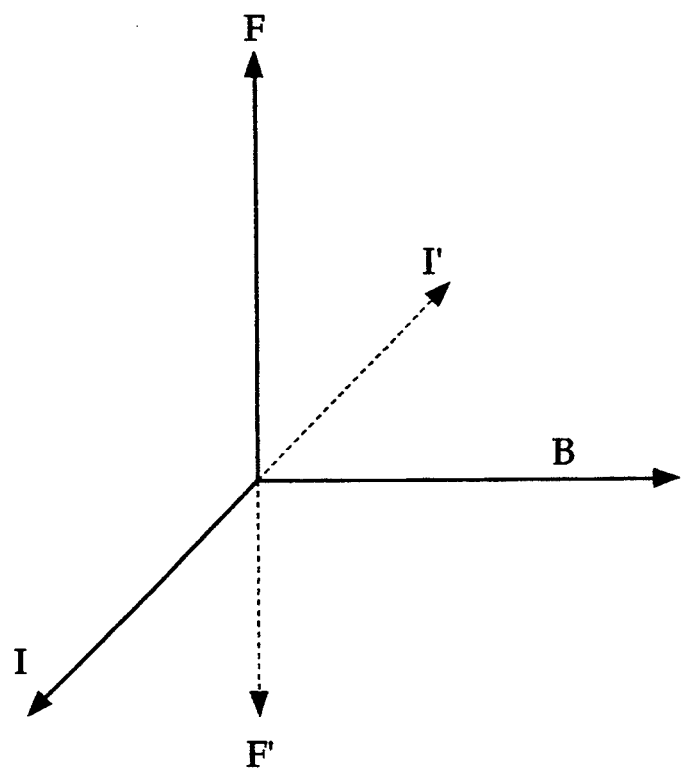
FIG. 2 is a three dimensional coordinate system showing the relationship of the electric current, magnetic field and force vectors, which allow the present invention to alternate the direction of the force exerted on the solder and deposit extremely small droplets of the solder on the PCB.

Referring to FIG. 2, the fundamental electromagnetic principles which are utilized by the present invention will be described. A three-dimensional cartesian coordinate system is shown wherein the magnetic field B, electric current I and resulting force F are all shown. Those skilled in the art will understand that the cross product of the electric current vector and the magnetic field will produce a force in a direction perpendicular to the plane in which both the electric current and magnetic field vectors lie, in accordance with the well known "right hand rule". This relationship is expressed by the equation $F = I \times B$. As shown in FIG. 2, when the cross product of the current vector I and magnetic field vector B is taken the resulting force will be in the direction as shown by the vector F. Alternatively, if the direction of the electric current is reversed such that it now flows in the direction in accordance with the vector I' the cross product of the negative current vector I' and the magnetic field B will result in a force vector in a direction as shown by vector F'. In this manner, it can be seen that reversing the direction of the current flow will in fact reverse the direction of the force as a result of the relationship between the current and magnetic field. The present invention utilizes this relationship in order to urge solder through nozzle 6 and then substantially instantaneously reversing the current flow through the solder 3 in order to "snap-off" a droplet. In this manner a droplet 7 can be placed on PCB 21 such that an extremely small quantity is placed on the circuit board. More particularly, by reversing the direction of the current, and thereby reversing the direction of the force, the surface tension of the solder droplet being formed at nozzle 6 is overcome such that the droplet will separate to create an extremely small droplet 7.

Figure 3:
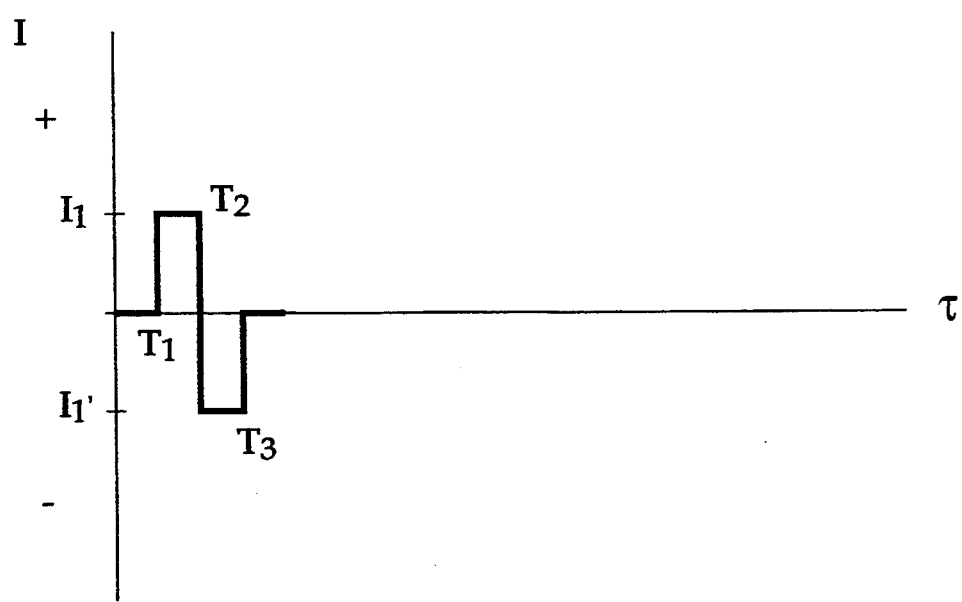
FIG. 3 is a chart showing an electric current versus time waveform that may be used by the system of the present invention to implement drop on demand solder deposition.

Next, the current wave form output by programmable current source 11 in accordance with the present invention will now be described with reference FIG. 3. A two-dimensional cartesian coordinate system is shown with current I in the Y axis position in time T in the X axis. When time equals zero, it can be seen that no current is being output from current source 11 and thus no force is acting upon solder 3 in accordance with the electromagnetic principles discussed above. At time T1, current source 11 outputs a positive current having a magnitude of I. Referring to FIG. 2 it can be seen that when a current of I is transmitted through solder 3, force in a direction F will be exerted on the solder. During the time period from T1 to T2, this force F1 is exerted upon the solder to urge it through conduit 5 and out nozzle 6. It should be noted that the time period T1–T2 can be varied in order to urge difference amounts of solder through nozzle 6. Once the desired amount of solder is urged through the nozzle, the direction of the current output from generator 11 is reversed at time T2. This current reversal occurs substantially instantaneously in accordance with a square wave output from the current source. At time T2 the current is reversed and flows in a negative direction having a magnitude of I'. Again referring to FIG. 2, when a current shown by I' is flowing the force exerted on the solder is in the direction F' which is opposite the direction F. In this manner, the force exerted on the solder 3 in conduit 5 when the current is reversed is in a direction away from nozzle 6 and acts to push the solder upwardly in the conduit. It can be seen that this upward force F' in conjunction with the previous downward force F will separate the solder at nozzle 6 to form droplets 7. Thus, a discrete droplet can be formed when the current and corresponding force, are reversed. During the time period from T1 to T2 the upward force is maintained due to the current flow from generator 11 in accordance with I'. This upward force is maintained for a sufficient time to allow the solder droplet to be formed, or "snapped-off". Once this time has elapsed, the current goes to zero until the next droplet is required, at which time the cycle, shown in FIG. 3, from T1 to T3 is repeated in order to form another droplet 7. Thus, it can be seen that the programmable current source can be continuously cycled from a positive current to a negative current to continuously form droplets 7 to be placed on PCB 21. It will be understood that the cycle time of alternating current generator 11 is extremely high having a magnitude on the order one (1) KHZ. Furthermore, the present invention is capable of being used in a "drop on demand" mode. That is, the current source can be programmed to deposit droplets on a PCB or device only as needed. In this case an upward force can be maintained on the solder to prevent downward movement due to gravity, until the next droplet is required, at which time the current is reversed thereby forcing solder through nozzle 6. In some cases the friction between the liquid solder and the conduit and nozzle may be great enough to prevent gravity from causing the solder to flow downwardly, and no current will be required to maintain the solder in the conduit. Additionally, it should be noted that the current direction I as positive and I' as negative in both FIGS. 2 and 3 are examples only and the relationship between the force, and magnetic field remain the same regardless of which direction is chosen as positive or negative. That is, in FIG. 2 if I' is considered to be in the positive direction the force F' will be exerted on solder 3 to urge it downwardly to the nozzle 6, rather than upwardly to "snap-off" the droplet 7.

Figure 4:
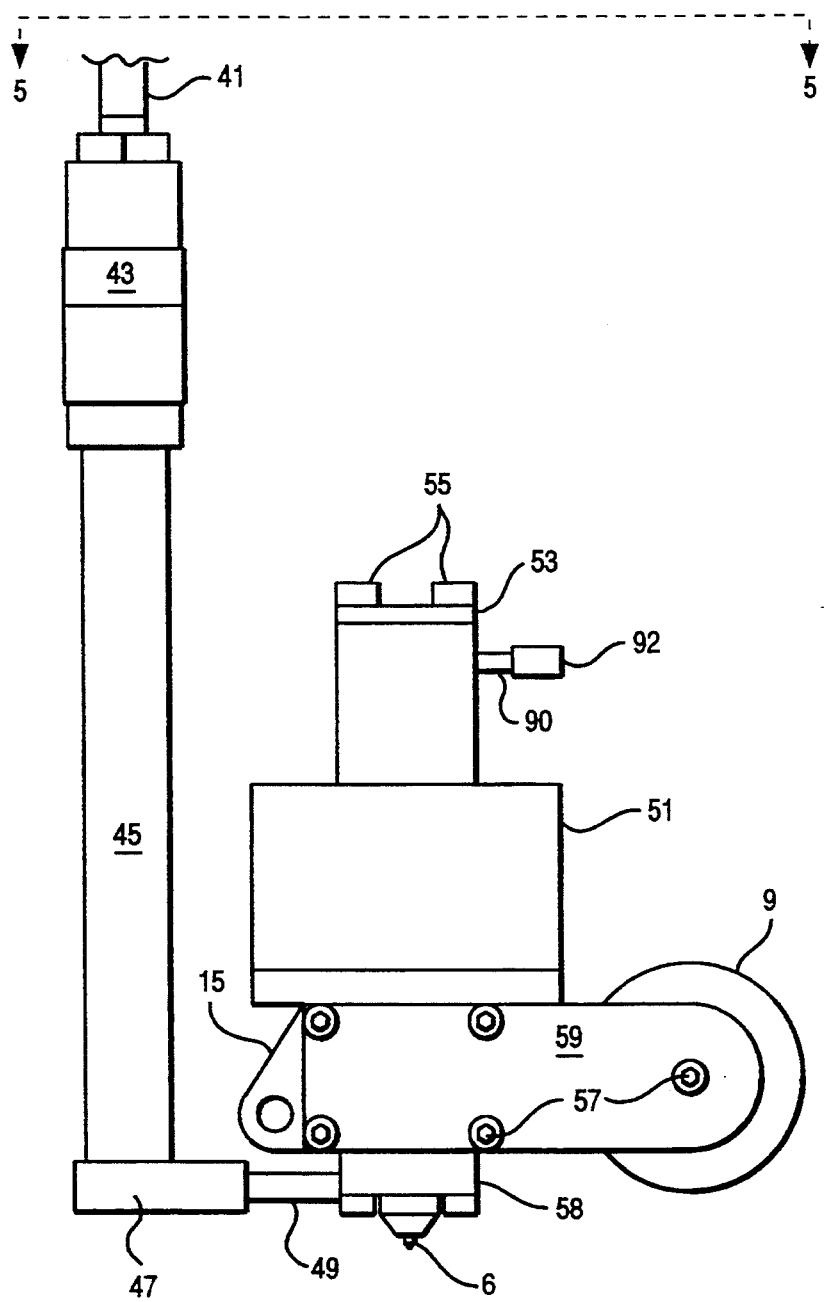
FIG. 4 is a front elevational view of the apparatus of the present invention, including the major structural components of the preferred embodiment.

FIG. 4 is an elevational view of the present invention showing the major components of a preferred embodiment. Housing 51 contains a solder reservoir 1 (FIGS. 1 and 6) and is connected to a magnet core 59 which supports magnetic coil 9 as well as electrodes 15 in the proper relationship to take advantage of the electrodynamic principles described previously with respect to FIGS. 2 and 3. Magnet core 59 is fabricated from a magnetically permeable material, such as iron, to provide a path to solder 3 in conduit 5 for the magnetic flux from coil 9. Surrounding components are constructed of non-magnetic materials, such as titanium, stainless steel, or ceramic, to prevent the magnetic flux from taking other paths and focus the magnetic field through the solder 3 in conduit 5. The magnet core 59 is electrically insulated from electrodes 15 by placing an insulating material, such as a ceramic, or dielectric coating intermediate the electrodes and core. Coil 9 and electrodes 15 are attached to magnetic core 59 by means of threaded connecting bolts 57, however other connection means as known in the art are contemplated by the present invention. Solder reservoir cover 53 is disposed on the top side of housing 51 and is securely fastened thereto by threaded connecting bolts 55. Vent 90 is disposed below cover 53, but above the solder level to maintain ambient pressure in reservoir 1 to prevent a vacuum (which would impede solder flow through conduit 5) from being created as the solder is dispensed. This vent also supplies inert gas via a hose 92, that prevents oxidation of solder 3. Nozzle support 58 is shown beneath core 59. Nozzle support 58 is affixed to core 59 and receives conduit 5 (not shown) which extends from reservoir 1 (FIG. 6) through magnet core 59. Nozzle support 58 will be described in more detail in conjunction with FIG. 6.

In order to maintain solder 3 in a molten form, the present invention circulates hot gas around nozzle 6. Gas heater 45 is provided adjacent to housing 51 and receives pressurized gas, or fluid such as nitrogen, argon, or other inert or non reactive fluids, from a hose 41 via connector 43. Subsequent to passing through heater 45, connector 47 receives the heated gas from heater 45 and provides the gas to tube 49. Tube 49 then provides pressurized and heated gas to nozzle support 58 for distribution around the periphery of nozzle 6. In this manner, the heated gas will maintain solder 3 at an adequate elevated temperature in order to ensure that solder 3 will remain in a molten state and protected from oxidization.

Figure 5:
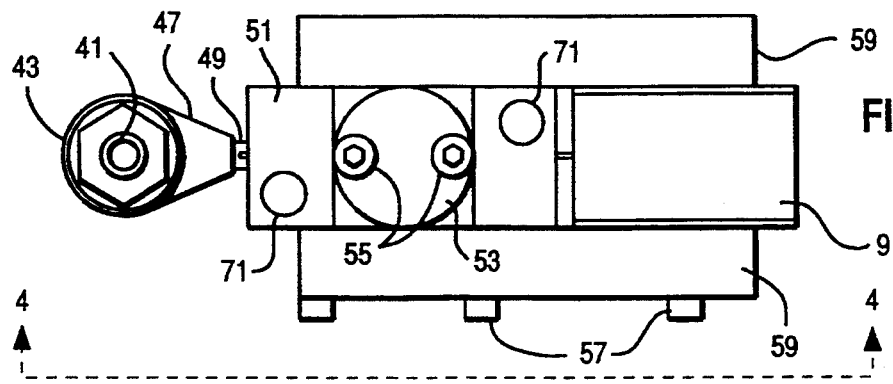
FIG. 5 is a plan view of the apparatus of FIG. 4, which shows additional structural components of the preferred embodiment.

Next, FIG. 5 will be described which is a plan view taken along line B—B of the elevational view of the apparatus of the present invention as shown in FIG. 4. Coil 9 is shown disposed adjacent magnet core 59 and held securely in place by connecting means 57. Housing 51, including solder reservoir 1, (FIG. 6) is shown disposed on core 59. Lid 53 and connecting means 55 are also shown on the plan view of FIG. 5. The gas heating means of FIG. 4 is also shown and includes like elements such as hose 41, connector 43, heater 45, connector 47 and reducer 49 which ultimately supplies heated gas to nozzle 6. Also shown in FIG. 5 are cartridge heaters 71 which are disposed adjacent to solder reservoir 1 and utilized to maintain solder 3 in a molten state while in reservoir 1. Cartridge heaters 71 are typically electrical resistance or inductance heating units insertable into a cavity of housing 51. In this manner, heat is radiated outwardly from cartridge heater 71 to reservoir 1 and solder 3. The heated gas circulating through nozzle 6 in conjunction with cartridge 71 ensure that solder 3 will be maintained in a molten state throughout the solder deposition process. That is, solder 3 is molten while in reservoir 1, due to cartridge heater 71, through conduit 5 and out nozzle 6 where it is subject to heating due to the gas flow from heater 45.

Figure 6:
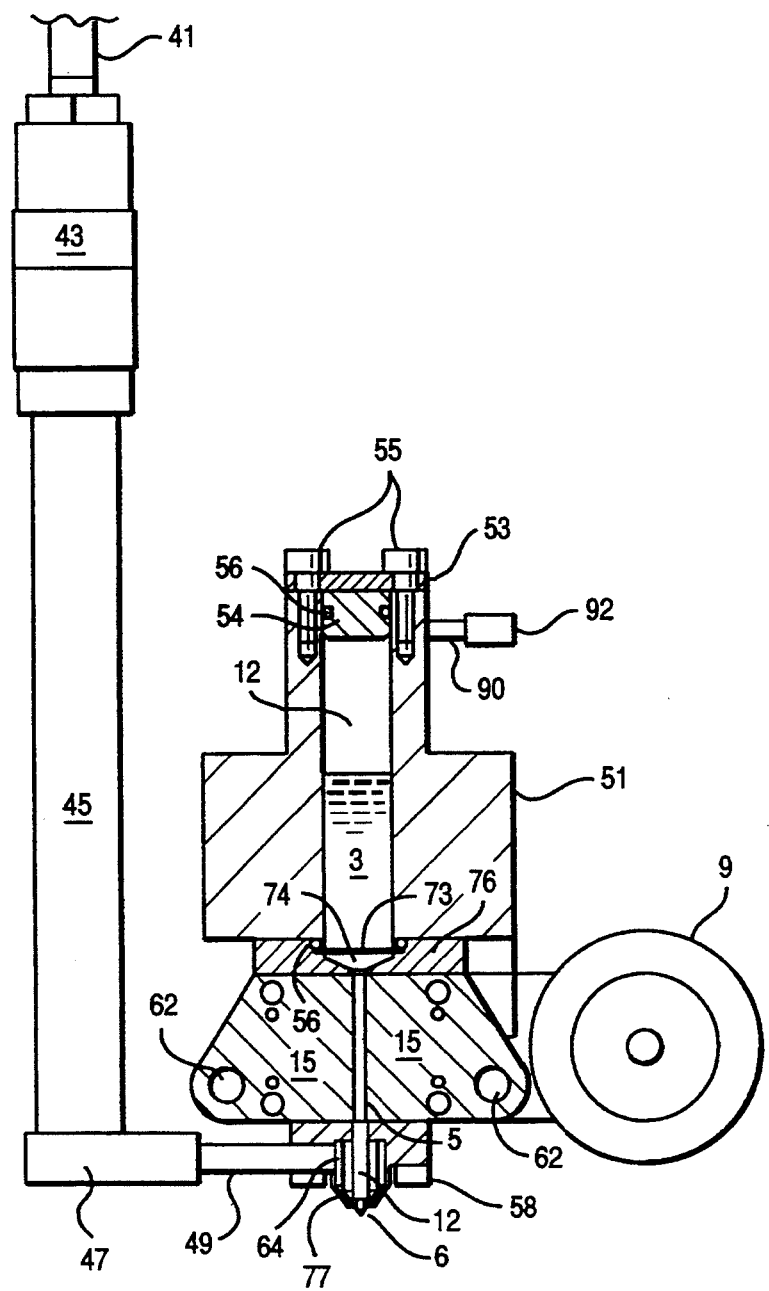
FIG. 6 is a crossectional view of the present invention taken along line A—A of FIG. 5 and illustrates the interior components of the apparatus, including the electrodes which apply current through the liquid solder.

Referring to FIG. 6, a cross-sectional elevation view of the apparatus of the present invention is shown as taken along line A—A of FIG. 5. Again, the gas heating means is shown and noted by reference numeral 41, 43, 45 and 47. Tube 49 is shown which supplies heated gas to nozzle support 58 for circulation around passageway 12 which is in communication with conduit 5. Thus, it can be seen that solder 3 is placed in reservoir 1 and subsequently flows through conduit 5, passageway 12 and ultimately nozzle 6. Passageway 64 is in communication with the interior of tube 49 such that heated gas flows from tube 49 into passageway 64 and around the periphery of passageway 12, thereby heating the molten solder 3 flowing therethrough. Additionally, heated gas from tube 49 is directed outwardly around the circumference of nozzle 6 through a gas nozzle 77 to heat the solder as it is flowing through the nozzle 6 and after droplet 7 is formed. Housing 51 is again shown in FIG. 6 and includes lid 53 and connecting means 55. Resilient sealing means 56 such as an O-ring, or the like is disposed annularly around lid 53 in order to provide a seal between lid 53 and frame 51. A filter means 73 is disposed between reservoir 1 and an intermediate support member 76 including a conical cavity 74, which is between reservoir 1 and conduit 5. Filter means 73 is a mesh material, or the like and is used to trap any contaminates which may be present in molten solder 3 such that the contaminating material will not clog conduit 5 or nozzle 6. As previously noted, vent tube 90 and hose 92 provide an inert, or non-reactive fluid to reservoir to prevent the solder 3 from becoming contaminated by oxidizing. Sealing means 56 are disposed around the periphery of reservoir 1 in order to ensure and adequate seal between housing 51 and intermediate member 76.

Electrodes 15 are then disposed adjacent to conduit 5 such that electrical current is passed through solder 3 flowing in conduit 5. Connecting lugs 62 are shown on each of electrodes 15 and are utilized to interconnect leads 13 from programmable current source 11 to electrodes 15. Non-magnetic spacers 92 are also provided that support the electrodes 15 in relation to core 59. Thus, it can be seen how the present invention allows electrical current to be passed through solder 3 flowing through conduit 5 in relation to magnetic field provided by coil 9. Electrodes 15 are electrically insulated from magnet core 59, intermediate element 76, non-magnetic spacers 92 and nozzle support 58 by dielectric coatings or electrical insulating films, resulting in the sole current path being through solder 3.

Figure 7:
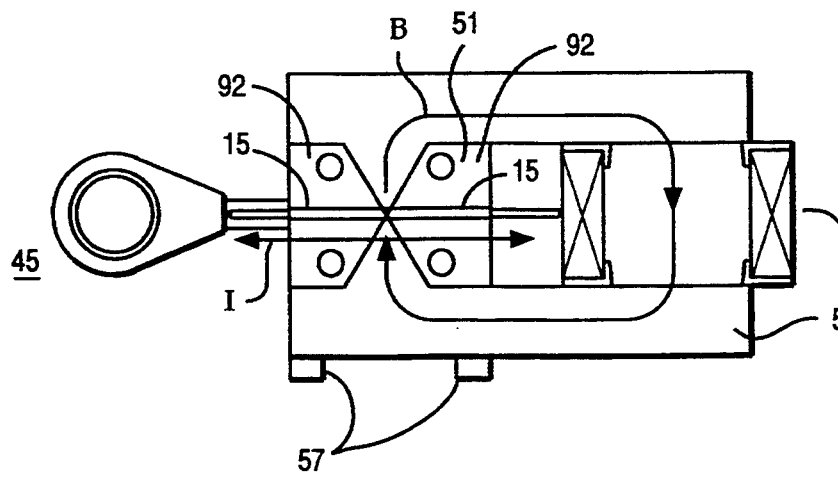
FIG. 7 is an interior plan view taken along line B—B of FIG. 4 showing the placement of the magnetic coil and magnetic flux path in the preferred embodiment of the present invention.

Referring to FIG. 7 a cross-sectional plan view taken along line B—B of FIG. 4 is shown. Gas heating means 45 are shown, as previously discussed, along with core 59, non-magnetic spacers 92 and connecting means 57. Electrodes 15 are shown disposed adjacent coil 9 such that the magnetic flux path B (provided through core 59) and the electric current path I (through electrodes 15) are co-planar and the electrical principles discussed in conjunction with FIG. 2 will cause a force to be exerted either downwardly or upwardly.

Although certain preferred embodiments have been shown and described, it should be understood that many changes and modification can be made therein without departing from the scope of the appended claims.

We claim:

1. A system for depositing a specific quantity of electrically conductive liquid on a component, comprising:
    means for supplying said conductive liquid;
    means for applying a magnetic field in a direction perpendicular to said means for supplying;
    means for transmitting electric current directly through said conductive liquid to exert a force on said conductive liquid in a first direction; and
    means for reversing a direction of said electric current to correspondingly reverse the direction of said force exerted on said conductive liquid to a second direction opposite said first direction to form a droplet of said conductive liquid.

2. A system according to claim 1 wherein said electric current is in a direction perpendicular to said means for supplying and coplanar with said magnetic field such that a force is exerted on said conductive liquid.

3. A system according to claim 2 wherein said means for transmitting comprises:
   a programmable electric current source capable of outputting alternating electric current of a predetermined duration; and
   electrode means, in contact with said conductive liquid, for passing said electric current through said liquid.

4. A system according to claim 3 wherein said means for applying comprises:
   a magnet; and
   a magnet core for providing a path for magnetic flux from said magnet to said means for supplying, such that said magnetic flux is concentrated through said conductive liquid.

5. A system according to claim 4 wherein said means for supplying comprises:
   reservoir means for storing a quantity of said conductive liquid;
   nozzle means for dispensing said conductive liquid onto said component; and
   conduit means for supplying said conductive liquid from said reservoir means for said nozzle means.

6. A system according to claim 5 wherein said conduit means is electrically insulated and receives said electrode means such that the electric current is passed through said conductive liquid.

7. A system according to claim 6, further comprising means for contacting said conductive liquid in said nozzle means with an inert fluid such that oxidization of said conductive liquid is prevented.

8. A system according to claim 7, further comprising:
   means for heating said inert fluid;
   means for heating said nozzle means; and
   means for directing said heated inert fluid outwardly to maintain a temperature of a droplet of said conductive fluid while the droplet is deposited on a component.

9. A system according to claim 1 further comprising means for varying a size of said droplet by varying a duration of said electric current in said first direction.

* * * * *